US012748399B2

(12) United States Patent
Km

(10) Patent No.: US 12,748,399 B2
(45) Date of Patent: Sep. 29, 2026

(54) SYSTEM AND METHOD FOR MONITORING AND MANAGING ENVIRONMENTAL CONDITIONS IN A DATA CENTER

(71) Applicant: STT Global Data Centres India Private Limited, Mumbai (IN)

(72) Inventor: Shankar Km, Bangalore (IN)

(73) Assignee: STT Global Data Centres India Private Limited, Mumbai (IN)

( * ) Notice: Subject to any disclaimer, the term of this patent is extended or adjusted under 35 U.S.C. 154(b) by 21 days.

(21) Appl. No.: 18/863,378

(22) PCT Filed: Jul. 13, 2022

(86) PCT No.: PCT/IB2022/056443

§ 371 (c)(1),
(2) Date: Nov. 6, 2024

(87) PCT Pub. No.: WO2023/214208

PCT Pub. Date: Nov. 9, 2023

(65) Prior Publication Data

US 2025/0315024 A1 Oct. 9, 2025

(30) Foreign Application Priority Data

May 6, 2022 (IN) ............................. 202221026483

(51) Int. Cl.
*G05B 19/042* (2006.01)
*H05K 7/14* (2006.01)

(52) U.S. Cl.
CPC ....... *G05B 19/0428* (2013.01); *H05K 7/1498* (2013.01); *G05B 2219/26* (2013.01)

(58) Field of Classification Search
CPC ........ G05B 19/0428; G05B 2219/2614; G05B 2219/2642; G08B 21/0288; G08B 21/0211; G08B 21/023; G06Q 10/1091
See application file for complete search history.

(56) References Cited

U.S. PATENT DOCUMENTS

2015/0355036 A1* 12/2015 Giorgi ................. H04L 12/2825 702/182
2017/0358194 A1* 12/2017 Glatfelter ............... G08B 21/12
(Continued)

FOREIGN PATENT DOCUMENTS

| | | | |
|---|---|---|---|
| CN | 109662403 | A | 4/2019 |
| WO | 2017006162 | A2 | 1/2017 |
| WO | 2017141220 | A1 | 8/2017 |

OTHER PUBLICATIONS

Beoncam: The 1st Ever Removable 360 Wrist Camera, https://www.indiegogo.com/projects/beoncam-the-1st-ever-removable-360-wrist-camera#/.

*Primary Examiner* — Vernal U Brown
(74) *Attorney, Agent, or Firm* — Jason C. Cameron

(57) ABSTRACT

A system for monitoring and managing environmental conditions in a data center includes a wearable monitoring entity and a controller unit having a processing subsystem. Environmental parameters are collected in real time during a monitoring routine using sensors associated with the wearable entity and sensors deployed within the data center. The processing subsystem analyzes the parameters to perform zoning based on sensor locations, identifies zones exhibiting abnormal conditions by comparison with threshold values, and generates alerts for corrective action. The system further prioritizes identified zones based on issue severity to facilitate efficient response. This approach enables improved detection, localization, and management of environmental conditions in data centers with reduced manual effort and enhanced operational reliability.

10 Claims, 5 Drawing Sheets

(56) References Cited

U.S. PATENT DOCUMENTS

| | | | | |
|---|---|---|---|---|
| 2019/0164402 | A1* | 5/2019 | Lin | G06Q 10/1091 |
| 2019/0373425 | A1* | 12/2019 | Gagnon | G05B 15/02 |
| 2023/0306374 | A1* | 9/2023 | Brid | G06F 1/163 |

* cited by examiner

SYSTEM AND METHOD FOR MONITORING AND MANAGING ENVIRONMENTAL CONDITIONS IN A DATA CENTER

EARLIEST PRIORITY DATE

This Application claims priority from a complete patent application filed in India having Patent Application No. 202221026483, filed on May 6, 2022 and titled "SYSTEM AND METHOD FOR MONITORING AND MANAGING ENVIRONMENTAL CONDITIONS IN A DATA CENTER", which has been granted; and a PCT Application no. PCT/IB2022/056443 filed on Jul. 13, 2022, and titled "SYSTEM AND METHOD FOR MONITORING AND MANAGING ENVIRONMENTAL CONDITIONS IN A DATA CENTER", which has been published as "WO2023214208A1".

FIELD OF INVENTION

Embodiments of a present disclosure relate to capturing environmental information, and more particularly to a system and a method for monitoring and managing one or more environmental conditions in a data center.

BACKGROUND

A data center is a building, a dedicated space within a building, or a group of buildings used to house computer systems and associated components, such as telecommunications and storage systems. Apart from intrusions and cyber-attacks, environmental conditions such as temperature, humidity, flood, power, smoke, and the like can cause costly downtime of the data center. Therefore, to keep data centers running efficiently and prevent unexpected outrages, it is crucial to monitor such environmental conditions. There are multiple approaches implemented for monitoring and managing the environmental conditions in the data centers.

One such approach includes a system exclusively designed for monitoring and measuring thermal conditions. The system also generates alerts so that preemptive action can be taken to prevent cooling outage failures or avoid cooling deviations in order to protect the vital ITEs housed in the data center.

One such another approach includes a standalone system for environmental monitoring and measurements of the data center. The standalone system connects sensors in various zones, rows, and racks as a grid—either wired or wirelessly—and is integrated into centralized or decentralized controllers to gather real-time data for close monitoring of the trend and to achieve cooling.

Apart from environmental monitoring, manual floor level measurements and monitoring are also in use in most data centers and their industries, which are generally carried out by Site operations engineers or technicians on a regular time interval, and the readings are recorded, allowing the site manager or team to take appropriate proactive action to avoid environmental-related failures.

However, such multiple approaches are associated with multiple limitations such as delay in reacting or a less efficient in reacting for changing sources of the environmental conditions. Also, less effective in identifying sources of failures in the data center, and less efficient in addressing the issues or the failures immediately. Moreover, such multiple approaches also require manual efforts for measuring and monitoring various zones inside of the data center. Further, the standalone system provides fewer opportunities for optimal usage of the corresponding standalone system. Furthermore, errors may occur as manual efforts are involved, thereby leading to cooling failures in the data centers.

Hence, there is a need for an improved system and method for monitoring and managing one or more environmental conditions in a data center which addresses the aforementioned issues.

BRIEF DESCRIPTION

In accordance with one embodiment of the disclosure, a system for monitoring and managing one or more environmental conditions in a data center is provided. The system includes a monitoring entity. The monitoring entity is adapted to get activated when worn by a first user upon registration. The monitoring entity is worn based on a monitoring schedule corresponding to the monitoring of the one or more environmental conditions inside of the data center. The monitoring schedule is set by a second user upon registration. The system also includes a controller unit. The controller unit is operatively coupled to the monitoring entity. The controller unit includes a processing subsystem. The processing subsystem is configured to execute on a network to control bidirectional communications among a plurality of modules. The processing subsystem includes a tracking module. The tracking module is configured to record an attendance for the first user based on an activation status corresponding to the monitoring entity. The processing subsystem also includes a monitoring module operatively coupled to the tracking module. The monitoring module is configured to receive one or more parameters corresponding to the corresponding one or more environmental conditions in real-time, when the first user initiates a routine-monitoring walk inside of the data center based on the monitoring schedule, upon recording a positive attendance for the first user. The one or more parameters are captured via at least one of one or more entity-associated sensors and one or more data center-associated sensors. Further, the processing subsystem also includes a zoning module operatively coupled to the monitoring module. The zoning module is configured to perform zoning of the one or more data center-associated sensors using a predefined clustering technique, based on a location of the corresponding one or more data center-associated sensors in the data center, upon receiving the one or more parameters. Furthermore, the processing subsystem also includes a zone identification module operatively coupled to the zoning module. The zone identification module is configured to identify one or more issue-related zones based on a comparison of the one or more parameters with one or more corresponding threshold parameters. Moreover, the processing subsystem also includes an issue addressing module operatively coupled to the zone identification module. The issue addressing module is configured to generate an issue-related alert upon identification of the one or more issue-related zones. The issue-related alert corresponds to an indication to perform one or more preventive actions for addressing one or more issues associated with the one or more issue-related zones. The issue addressing module is also configured to prioritize at least one of the one or more issue-related zones for addressing the corresponding one or more issues, based on an analysis of a complexity associated with the corresponding one or more issues, upon generating the issue-related alert, thereby monitoring and managing the one or more environmental conditions in the data center.

In accordance with another embodiment, a method for monitoring and managing one or more environmental conditions in a data center is provided. The method includes activating a monitoring entity when worn by a first user upon registration, wherein the monitoring entity is worn based on a monitoring schedule corresponding to the monitoring of the one or more environmental conditions inside of the data center, wherein the monitoring schedule is set by a second user upon registration. The method also includes enabling an operative coupling of the monitoring entity with a controller unit, wherein the controller unit includes a processing subsystem configured to execute on a network to control bidirectional communications among a plurality of modules. Further, the method also includes recording an attendance for the first user based on an activation status corresponding to the monitoring entity. Furthermore, the method also includes receiving one or more parameters corresponding to the corresponding one or more environmental conditions in real-time, when the first user initiates a routine-monitoring walk inside of the data center based on the monitoring schedule, upon recording a positive attendance for the first user, wherein the one or more parameters are captured via at least one of one or more entity-associated sensors and one or more data center-associated sensors. Moreover, the method also includes performing zoning of the one or more data center-associated sensors using a predefined clustering technique, based on a location of the corresponding one or more data center-associated sensors in the data center, upon receiving the one or more parameters. In addition, the method also includes identifying one or more issue-related zones based on a comparison of the one or more parameters with one or more corresponding threshold parameters. The method also includes generating an issue-related alert upon identification of the one or more issue-related zones, wherein the issue-related alert corresponds to an indication to perform one or more preventive actions for addressing one or more issues associated with the one or more issue-related zones. Further, the method also includes prioritizing at least one of the one or more issue-related zones for addressing the corresponding one or more issues, based on an analysis of a complexity associated with the corresponding one or more issues, upon generating the issue-related alert, thereby monitoring and managing the one or more environmental conditions in the data center.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF THE DRAWINGS

The disclosure will be described and explained with additional specificity and detail with the accompanying figures in which:

FIG. 4(*b*) is a flow chart representing continued steps involved in the method of FIG. 4(*a*) in accordance with an embodiment of the present disclosure.

Figure 1:
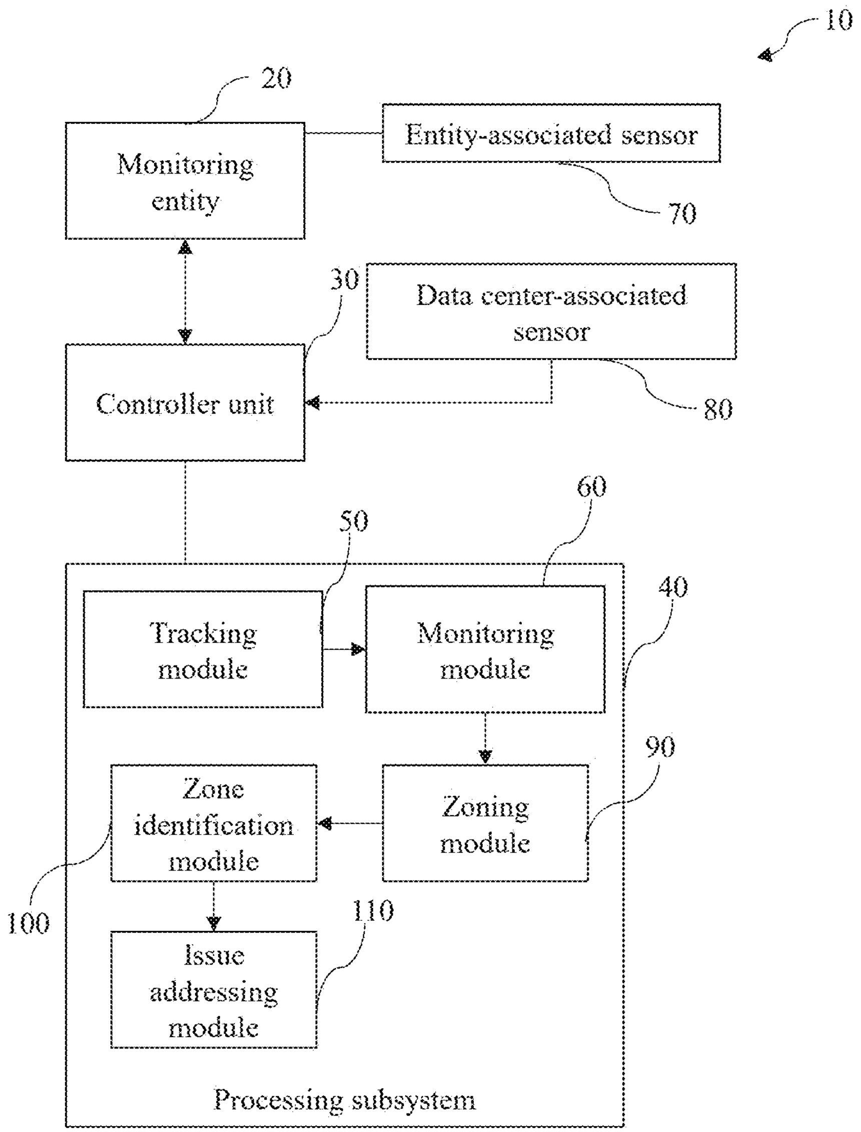
FIG. 1 is a block diagram representation of a system for monitoring and managing one or more environmental conditions in a data center in accordance with an embodiment of the present disclosure.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure.

The terms "comprises", "comprising", or any other variations thereof, are intended to cover a non-exclusive inclusion, such that a process or method that comprises a list of steps does not include only those steps but may include other steps not expressly listed or inherent to such a process or method. Similarly, one or more devices or sub-systems or elements or structures or components preceded by "comprises . . . a" does not, without more constraints, preclude the existence of other devices, sub-systems, elements, structures, components, additional devices, additional sub-systems, additional elements, additional structures or additional components. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

In the following specification and the claims, reference will be made to a number of terms, which shall be defined to have the following meanings. The singular forms "a", "an", and "the" include plural references unless the context clearly dictates otherwise.

Embodiments of the present disclosure relate to a system for monitoring and managing one or more environmental conditions in a data center. As used herein, the term "data center" is defined as a building, a dedicated space within a building, or a group of buildings used to house computer systems and associated components, such as telecommunications and storage systems. The one or more environmental conditions such as temperature, humidity, flood, power, smoke, and the like can cause costly downtime of the data center. Thus, the system described hereafter in FIG. 1 is the system for monitoring and managing the one or more environmental conditions in the data center.

FIG. 1 is a block diagram representation of a system 10 for monitoring and managing one or more environmental conditions in a data center in accordance with an embodiment of the present disclosure. The system 10 includes a monitoring entity 20. In one embodiment, the monitoring entity 20 may be a coat. The coat may be a thermal coat. The monitoring entity 20 is adapted to get activated when worn by a first user upon registration. In one embodiment, the first user may be a site operation engineer, a technician, or the like. Basically, the first user may be a person responsible for taking rounds inside of the data center for monitoring the one or more environmental conditions in the data center.

In one embodiment, the monitoring entity 20 may be placed inside a docking station, wherein the docking station may be positioned inside the data center. The docking station may be a closed space such as a room, a cabinet, a partition, or the like. The docking station may be adapted to provide a facility for charging the monitoring entity 20, when the corresponding monitoring entity 20 may be placed inside of the corresponding docking station. Therefore, in an embodiment, the docking station may be provided with one or more charging points, wherein the one or more charging points may be connected to one or more power supplies. Further, when the first user visits the docking station and wears the monitoring entity 20, the monitoring entity 20 may get activated.

The monitoring entity 20 is worn based on a monitoring schedule corresponding to the monitoring of the one or more environmental conditions inside the data center. The monitoring schedule is set by a second user upon registration. In one embodiment, the second user may be a site manager, a site operation team, or the like.

The system 10 also includes a controller unit 30. The controller unit 30 is operatively coupled to the monitoring entity 20. The activation of the controller unit 30 may correspond to the activation of the controller unit 30. The controller unit 30 includes a processing subsystem 40. In one exemplary embodiment, the processing subsystem 40 may be hosted on a server. In one embodiment, the server may include a cloud server. In another embodiment, the server may include a local server. The processing subsystem 40 is configured to execute on a network (not shown in FIG. 1) to control bidirectional communications among a plurality of modules. In one embodiment, the network may include a wired network such as a local area network (LAN). In another embodiment, the network may include a wireless network such as wireless fidelity (Wi-Fi), Bluetooth, Zigbee, near field communication (NFC), an infrared communication, or the like.

Figure 2:
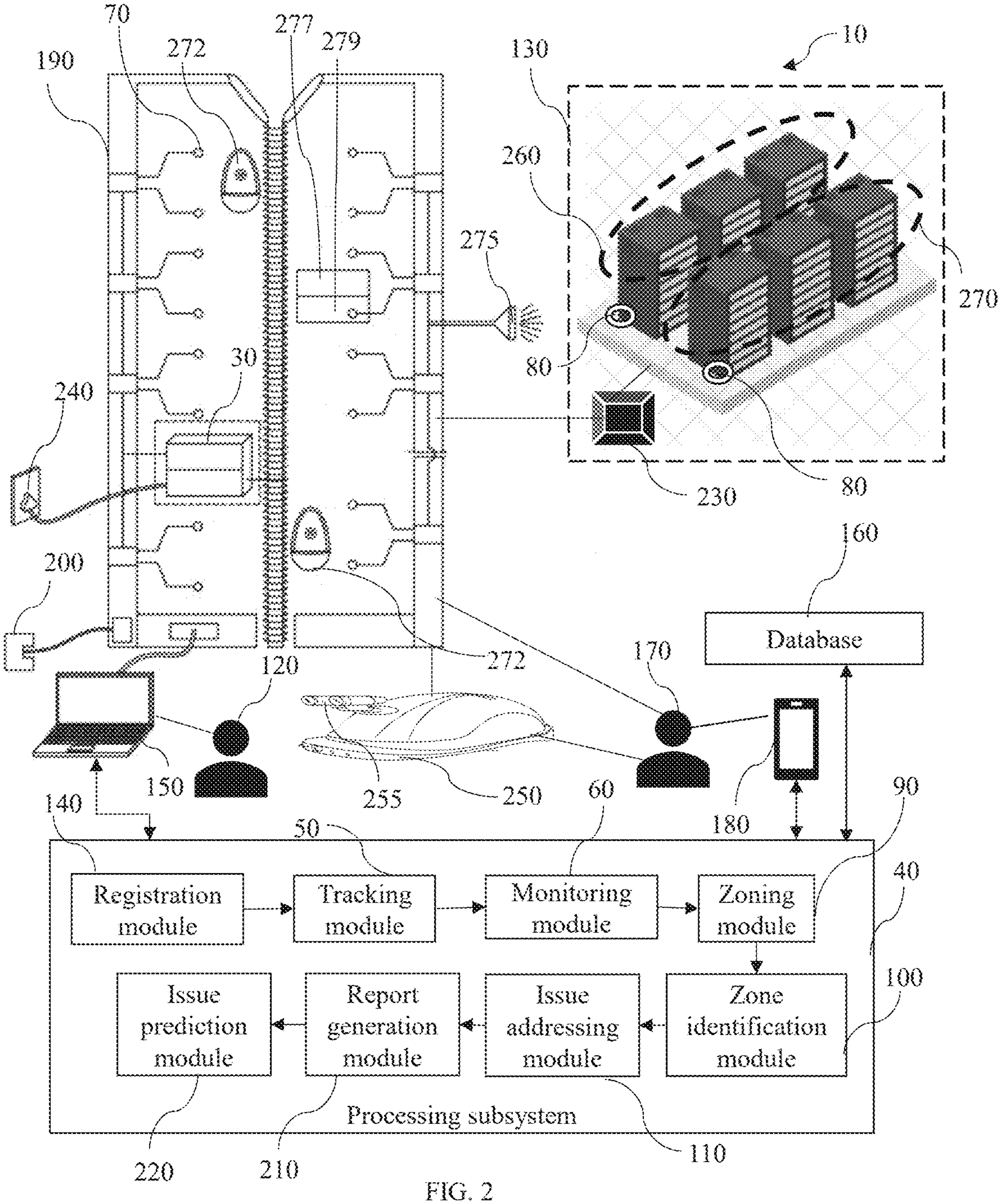
FIG. 2 is a block diagram representation of an exemplary embodiment of the system for monitoring and managing one or more environmental conditions in a data center of FIG. 1 in accordance with an embodiment of the present disclosure.

Further, for the first user to be able to use the monitoring entity 20 for monitoring the one or more environmental conditions in the data center, the first user may have to be registered with the system 10. Therefore, in an embodiment, the processing subsystem 40 may include a registration module (as shown in FIG. 2). The registration module may be configured to register the first user with the system 10 upon receiving a plurality of first user details via a first user device. In one embodiment, the plurality of first user details may be stored in a database (as shown in FIG. 2). In one exemplary embodiment, the database may include a local database or a cloud database. In one exemplary embodiment, the plurality of first user details may include at least one of a username, contact details, age, gender, education details, qualification details, and the like corresponding to the first user. In an embodiment, the first user device may include a mobile phone, a tablet, a laptop, or the like belonging to the corresponding first user.

Furthermore, for the second user to be able to use the system 10, the second user may also have to be registered with the system 10. Therefore, the registration module may also be configured to register the second user with the system 10 upon receiving a plurality of second user details via a second user device. In one embodiment, the plurality of second user details may be stored in the database. In one exemplary embodiment, the plurality of second user details may include at least one of a username, contact details, age, gender, education details, qualification details, and the like corresponding to the second user. In an embodiment, the second user device may include a mobile phone, a tablet, a laptop, or the like belonging to the corresponding second user.

The processing subsystem 40 includes a tracking module 50. The tracking module 50 may be operatively coupled to the registration module. The tracking module 50 is configured to record an attendance for the first user based on an activation status corresponding to the monitoring entity 20. In one embodiment, the attendance recorded may be 'present' when the activation status may be 'active'. In another embodiment, the attendance recorded may be 'absent' when the activation status may be 'inactive'. Moreover, in an embodiment, the attendance may be a positive attendance or a negative attendance. The positive attendance may correspond to the attendance being 'present'. The negative attendance may correspond to the attendance being 'absent'.

The processing subsystem 40 also includes a monitoring module 60 operatively coupled to the tracking module 50. The monitoring module 60 is configured to receive one or more parameters corresponding to the corresponding one or more environmental conditions in real-time, when the first user initiates a routine-monitoring walk inside of the data center based on the monitoring schedule, upon recording the positive attendance for the first user. The one or more parameters are captured via at least one of one or more entity-associated sensors 70 and one or more data center-associated sensors 80. As used herein, the term "entity-associated sensor" refers to a sensor that is associated with or mounted on the monitoring entity 20. Similarly, as used herein, the term "data center-associated sensor" refers to a sensor that is associated with or mounted at different places inside of the data center. In one exemplary embodiment, the one or more entity-associated sensors 70 and the one or more data center-associated sensors 80 may include at least one of one or more Internet of Things (IoT) sensors, a temperature sensor, a corrosion sensor, a thermal camera, a cliff sensor, an Infrared (IR) sensor, and the like.

Further, in an embodiment, the activation of the monitoring entity 20 may correspond to the activation of the one or more entity-associated sensors 70. As the first user initiates the routine-monitoring walk inside of the data center, the one or more entity-associated sensors 70 may start to capture or sense the one or more parameters corresponding to the corresponding one or more environmental conditions in real-time. Moreover, the monitoring entity 20 may also receive the one or more parameters sensed or captured by the one or more data center-associated sensors 80 via the monitoring module 60. In one exemplary embodiment, the one or more parameters may include at least one of temperature, humidity, relative humidity, smoke, fire, power, voltage, a hurdle in a path of the first user, and the like.

Upon receiving the one or more parameters, the one or more parameters may have to be analyzed, and certain interpretations may have to be obtained for managing the one or more environmental conditions inside the data center. Prior to this, as the data center may be a huge entity, the data center may have to be categorized into several zones. Therefore, the processing subsystem 40 also includes a zoning module 90 operatively coupled to the monitoring module 60. The zoning module 90 is configured to perform zoning of the one or more data center-associated sensors 80 using a predefined clustering technique, based on a location of the corresponding one or more data center-associated sensors 80 in the data center, upon receiving the one or more parameters. Basically, zoning of the one or more data center-associated sensors (80) may indirectly perform the zoning of the data center.

In one embodiment, zoning of the one or more data center-associated sensors 80 may include zoning of the data center into one or more zones. Each of the one or more zones in the data center may have at least one of the one or more data center-associated sensors 80. Further, as used herein, the term "clustering technique" is a Machine Learning technique that involves the grouping of data points. Given a set of data points, we can use the clustering technique to classify each data point into a specific group. Therefore, in an embodiment, the zoning module 90 may be configured to receive a data center map in a predefined form upon registration of the second user. The zoning module 90 may also be configured to identify a layout of the data center upon analyzing the data center map using an artificial intelligence (AI)-based technique. The zoning module 90 may further be configured to identify a location of the one or more data center-associated sensors 80 positioned inside of the data center, based on the identification of the layout of the data center. Finally, the zoning module 90 may be configured to perform the zoning of the one or more data center-associated sensors 80 using the predefined clustering technique, based on the location of the corresponding one or more data center-associated sensors 80.

In one exemplary embodiment, the predefined form of the data center map may correspond to a text form, an image form, a portable document format (pdf) form, or the like. As used herein, the term "data enter map" is a physical and/or logical layout of an infrastructure and resources of the data center. Further, as used herein, the term "artificial intelligence" is defined as the ability of a computer or a robot controlled by a computer to do tasks that are usually done by humans because they require human intelligence and discernment. In one embodiment, the AI-based technique may include a natural language processing (NLP) technique, an image processing technique, or the like.

As used herein, the term "natural language processing" is defined as a branch of AI that helps computers understand, interpret and manipulate human language. Here, predefined historic data may be used to train a model that may be used for an operation of the NLP, wherein the predefined historic data may include a word dictionary of a plurality of words with meaning. Further, as used herein, the term "image processing technique" is defined as a method to perform some operations on an image, in order to get an enhanced image or to extract some useful information from it. Therefore, based on the predefined form of the data center map, the AI-based technique may be chosen by the zoning module 90 for analyzing the data center map, thereby identifying and remembering the layout of the data center.

Upon zoning, identifying a zone having certain issues may have to be carried out. Therefore, the processing subsystem 40 also includes a zone identification module 100 operatively coupled to the zoning module 90. The zone identification module 100 is configured to identify one or more issue-related zones based on a comparison of the one or more parameters with one or more corresponding threshold parameters. Basically, in an embodiment, the one or more issue-related zones may be identified, when the one or more parameters deviate from the one or more corresponding threshold parameters upon comparison.

Upon identifying the one or more issue-related zones, one or more issues associated with the corresponding one or more issue-related zones may have to be addressed to prevent an occurring of any kind of damage to the data center. Therefore, the processing subsystem 40 also includes an issue addressing module 110 operatively coupled to the zone identification module 100. The issue addressing module 110 is configured to generate an issue-related alert upon identification of the one or more issue-related zones. In one embodiment, the issue-related alert may be an alarm, a text message, an e-mail, a pop-up notification, or the like. The issue-related alert corresponds to an indication to perform one or more preventive actions for addressing the one or more issues associated with the one or more issue-related zones. In one exemplary embodiment, the one or more issues may include a deviation of temperature from a threshold temperature value, deviation of humidity from a threshold humidity value, and the like.

In one embodiment, the one or more preventive actions may be either performed by the first user or the second user. Moreover, in an embodiment, the one or more preventive actions may correspond to getting a device repaired inside of the data center when a fault is detected in the corresponding device, adjusting a temperature of a cooling system located inside of the data center when a temperature has crossed a threshold temperature value, and the like.

Upon identifying the one or more issue-related zones, identifying which issue or which issue-related zone to address first may also be important. Therefore, the issue addressing module 110 is also configured to prioritize at least one of the one or more issue-related zones for addressing the corresponding one or more issues, based on an analysis of a complexity associated with the corresponding one or more issues, upon generating the issue-related alert, thereby monitoring and managing the one or more environmental conditions in the data center. Basically, the complexity associated with the one or more issues in the corresponding one or more issue-related zones may be compared with each other, and an issue-related zone with a higher complexity may be prioritized by the issue addressing module 110. Once the first user or the second user gets to know about this priority, the first user or the second user may perform the one or more preventive actions for addressing the corresponding one or more issues.

Subsequently, in an embodiment, the issue addressing module 110 may also be configured to identify a shortest distance to the corresponding one or more issue-related zones from an entry point of the data center based on an analysis of the layout of the data center, upon prioritizing. Basically, in an embodiment, one or more paths between the entry point of the data center and the one or more issue-related zones may be compared with each other. Further, upon comparison, at least one of the one or more paths having the shortest distance may be suggested to the first user to take, for addressing the corresponding one or more issues.

In addition, the tracking module 50 may also be configured to track and record at least one of a timestamp and a frequency of an entry and an exit of the first user corresponding to the data center based on the attendance recorded.

Also, in an embodiment, the system 10 may also include one or more safety entities (not shown in FIG. 1) integrated with the monitoring entity 20. The one or more safety entities may be adapted to generate a safety-issue alert, upon detection of a displacement of the corresponding one or more safety entities. In such embodiment, the one or more safety entities may include a safety helmet, a pair of gloves, and the like. Basically, the one or more safety entities may be associated with one or more safety sensors such as a proximity sensor, an IR sensor, and the like. Therefore, upon detection of the displacement of the one or more safety entities via the one or more safety sensors, the safety-issue alert may be generated by the corresponding one or more safety entities. The safety-issue alert may be an alarm, a text message, an e-mail, a pop-up notification, or the like. The safety-issue alert may correspond to an indication for at least one of the first user to place the corresponding one or more safety entities in position and the second user to indicate that the first user has not worn the corresponding one or more safety entities.

Furthermore, in another embodiment, the one or more safety entities may be adapted to get activated upon detection of a deviation of a safety-related parameter inside of the data center from a threshold safety-related parameter value. In such embodiment, the one or more safety entities may include a torch, an illumination unit, a display unit, and the like. Moreover, the one or more safety sensors may include an illumination intensity detection sensor, a cliff sensor, and the like. Further, the safety-related parameter may include an illumination intensity, a presence of a hurdle, and the like. For example, if the illumination intensity at a certain location inside of the data center is less than a threshold intensity value, then the first user may be in need of an extra illumination to get proper visibility inside of the data center. In such a situation, the torch mounted on the safety helmet worn by the first user may turn on and get adjusted to a preferred illumination level.

Additionally, in an embodiment, the processing subsystem 40 may also include a report generation module (as shown in FIG. 2) operatively coupled to the issue addressing module 110. The report generation module may be configured to generate a report personalized to the first user in real-time upon completion of the routine-monitoring walk by the first user. The report may include a plurality of details corresponding to the monitoring and managing of the one or more environmental conditions in the data center. In one embodiment, the plurality of details may include at least one of a plurality of first user details, one or more values associated with the one or more parameters, information of the one or more issue-related zones, a priority associated with the one or more issue-related zones, and the like.

Further, in one embodiment, the processing subsystem 40 may also include an issue prediction module (as shown in FIG. 2) operatively coupled to the report generation module. The issue prediction module may be configured to perform data analytics on the corresponding report, by generating one or more trends corresponding to the plurality of details extracted from the report over a predefined time period. As used herein, the term "data analytics" refers to the pursuit of extracting meaning from raw data using specialized computer systems. These systems transform, organize, and model the data to draw conclusions and identify patterns. In one embodiment, the predefined time period may be a week, a month, three months, six months, a year, or the like.

Furthermore, the issue prediction module may also be configured to predict one or more expected issues corresponding to the one or more environmental conditions inside of the data center using an AI-based trained model, based on the data analytics performed on the corresponding report. Basically, to predict the one or more expected issues, the AI-based trained model may be trained with an extensive set of a plurality of patterns that may be associated with the plurality of details extracted from the report, using AI. Then, the AI-based trained model may be used to predict the one or more expected issues that may occur in the data center.

FIG. 2 is a block diagram representation of an exemplary embodiment of the system 10 for monitoring and managing the one or more environmental conditions in the data center of FIG. 1 in accordance with an embodiment of the present disclosure. Suppose a site manager 'X' 120 of a data center 'Y' 130 is willing to get the one or more environmental conditions of the corresponding data center 'Y' 130 monitored and managed. Therefore, the site manager 'X' 120 registers with the system 10 via the registration module 140 upon providing a plurality of site manager details via a manager laptop 150. The plurality of site manager details is stored in the database 160 of the system 10. Then, the site manager 'X' 120 sets the monitoring schedule. Further, the site manager 'X' 120 appoints a technician 'Z' 170 to take rounds inside of the data center 'Y' 130 according to the monitoring schedule. The technician 'Z' 170 also registers with the system 10 via the registration module 140 by providing a plurality of personal details via a personal mobile phone 180. The system 10 includes a thermal coat 190, wherein the thermal coat 190 is supposed to be worn by the technician 'Z' 170 while taking rounds inside of the data center 'Y' 130.

The system 10 also includes the controller unit 30 including the processing subsystem 40, wherein the processing subsystem 40 executes on a LAN network 200 to control bidirectional communications among the plurality of modules including the registration module 140, the tracking module 50, the monitoring module 60, the zoning module 90, the zone identification module 100, the issue addressing module 110, the report generation module 210, and the issue prediction module 220. The thermal coat 190 is placed inside a docking station 230. The docking station 230 is positioned inside of the data center 'Y' 130, where the thermal coat 190 is placed for charging via a charging dock 240.

Further, when the technician 'Z' 170 visits the data center 'Y' 130 and wears the thermal coat 190, then the thermal coat 190 gets activated. Upon activation, the attendance for the technician 'Z' 170 is recorded as 'present' which is the positive attendance, via the tracking module 50. Upon activation of the thermal coat 190, the technician 'Z' 170 starts to walk into the data center 'Y' 130. Furthermore, the technician 'Z' 170 is also supposed to wear the safety helmet 250 which is having the torch 255. If the technician 'Z' 170 fails to wear the safety helmet 250, then the corresponding safety helmet 250 generates the safety-issue alert indicating the technician 'Z' 170 to wear the safety helmet 250 and the site manager 'X' 120 to assist the technician 'Z' 170 in maintaining one or more safety measures.

Furthermore, as the technician 'Z' 170 is walking inside of the data center 'Y' 130, the one or more parameters from the one or more entity-associated sensors 70 and the one or more data center-associated sensors 80 are received via the monitoring module 60. Then, based on the location of the one or more data center-associated sensors 80, zoning of the one or more data center-associated sensors 80 is performed via the zoning module 90. Suppose the data center 'Y' 130 has two major zones named as a zone 'Z1' 260 and a zone 'Z2' 270. Suppose in the zone 'Z1' 260, an issue has occurred in which a temperature in the zone 'Z1' 260 is greater than a threshold temperature value. Here, the temperature is sensed via the thermal camera 272. Also, in zone 'Z2' 270, the same issue has occurred but the temperature here is higher than that in the zone 'Z1' 260. This is identified to be coming under the one or more issue-related zones identified via the zone identification module 100. Upon identifying the one or more issue-related zones, the issue-related alert is sent to the technician 'Z' 170 and as well as to the site manager 'X' 120 via the issue addressing module 110, so that either the technician 'Z' 170 or the site manager 'X' 120 can take certain actions to address the issues in the one or more issue-related zones. The issue-related alert is generated via a buzzer 275.

Moreover, the zone 'Z2' 270 is prioritized over the zone 'Z1' 260 via the issue addressing module 110, as the temperature in the zone 'Z2' 270 is higher than that in the zone 'Z1' 260. Upon prioritizing, the shortest distance between the entry point of the data center 'Y' 130 and the zone 'Z2' 270 is identified via the issue addressing module 110, and then the shortest distance between the entry point and the zone 'Z1' 260 is identified. Then, the technician 'Z' 170 visits each of the zones and addresses both the issues. Now, the report having all the details performed when the technician 'Z' 170 was in charge of monitoring the data center 'Y' 130 is generated via the report generation module 210. The report generated is stored in the database 160 and can be used for future reference. One of the future uses of the report is to predict the one or more expected issues that may occur inside of the data center 'Y' 130 which may need to be taken care of at early stages to avoid a huge damage to the data center 'Y' 130. This prediction is done via the issue prediction module 220 by performing the data analytics on the plurality of details extracted from the report, thereby monitoring and managing the one or more environmental conditions in the data center 'Y' 130. The thermal coat 190 is also integrated with a display unit 277 and a keyboard 279.

Figure 3:
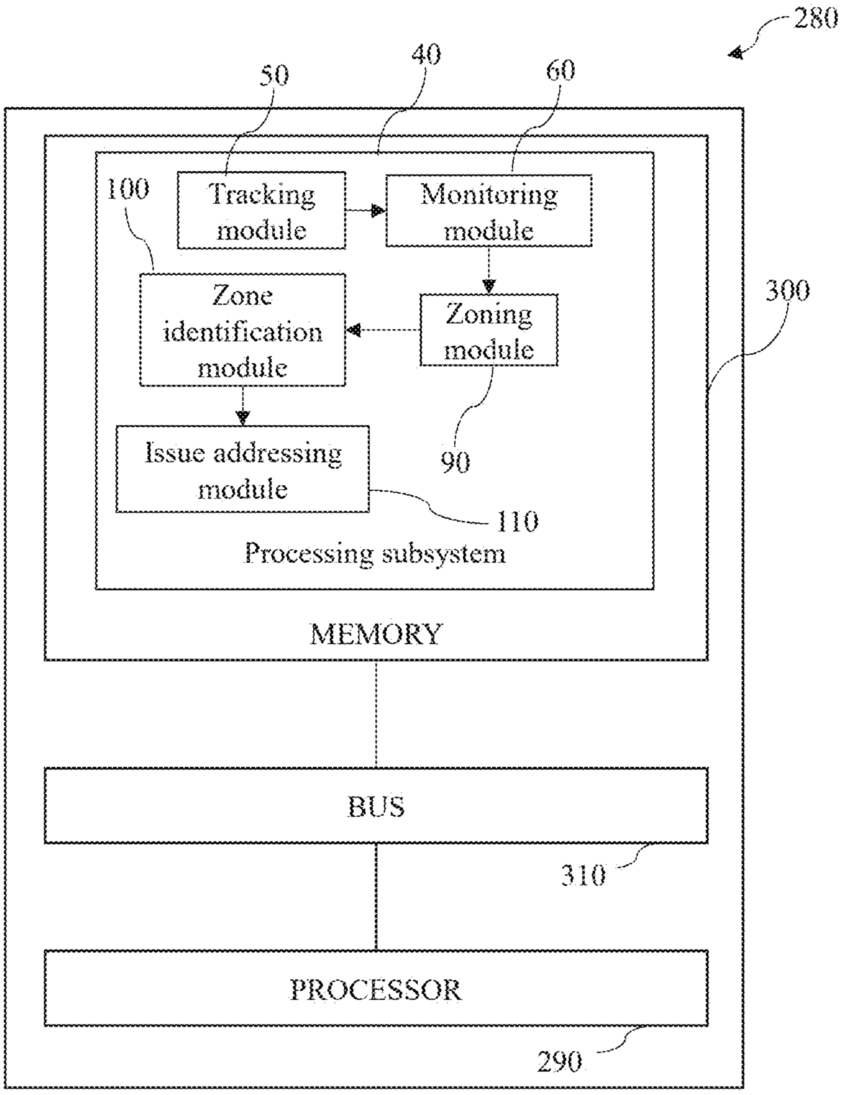
FIG. 3 is a block diagram of an environmental condition monitoring computer or an environmental condition monitoring server in accordance with an embodiment of the present disclosure.

FIG. 3 is a block diagram of an environmental condition monitoring computer or an environmental condition monitoring server 280 in accordance with an embodiment of the present disclosure. The environmental condition monitoring server 280 includes processor(s) 290, and a memory 300 operatively coupled to a bus 310. The processor(s) 290, as used herein, means any type of computational circuit, such as, but not limited to, a microprocessor, a microcontroller, a complex instruction set computing microprocessor, a reduced instruction set computing microprocessor, a very long instruction word microprocessor, an explicitly parallel instruction computing microprocessor, a digital signal processor, or any other type of processing circuit, or a combination thereof.

Computer memory elements may include any suitable memory device(s) for storing data and executable program, such as read only memory, random access memory, erasable programmable read only memory, electrically erasable programmable read only memory, hard drive, removable media drive for handling memory cards and the like. Embodiments of the present subject matter may be implemented in conjunction with program modules, including functions, procedures, data structures, and application programs, for performing tasks, or defining abstract data types or low-level hardware contexts. Executable program stored on any of the above-mentioned storage media may be executable by the processor(s) 290.

Figure 4:
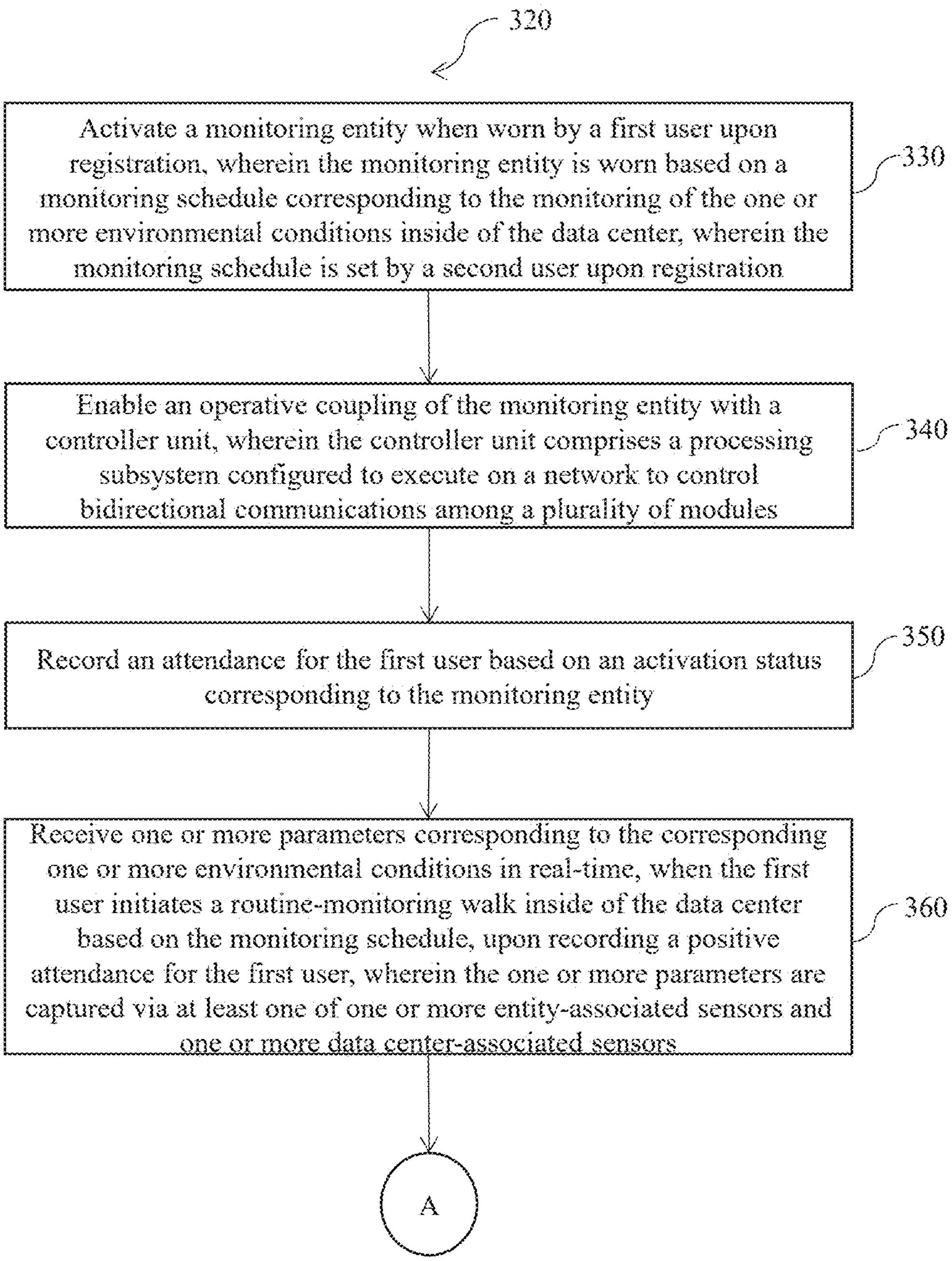
FIG. 4(*a*) is a flow chart representing steps involved in a method for monitoring and managing one or more environmental conditions in a data center in accordance with an embodiment of the present disclosure.
Figure 4:
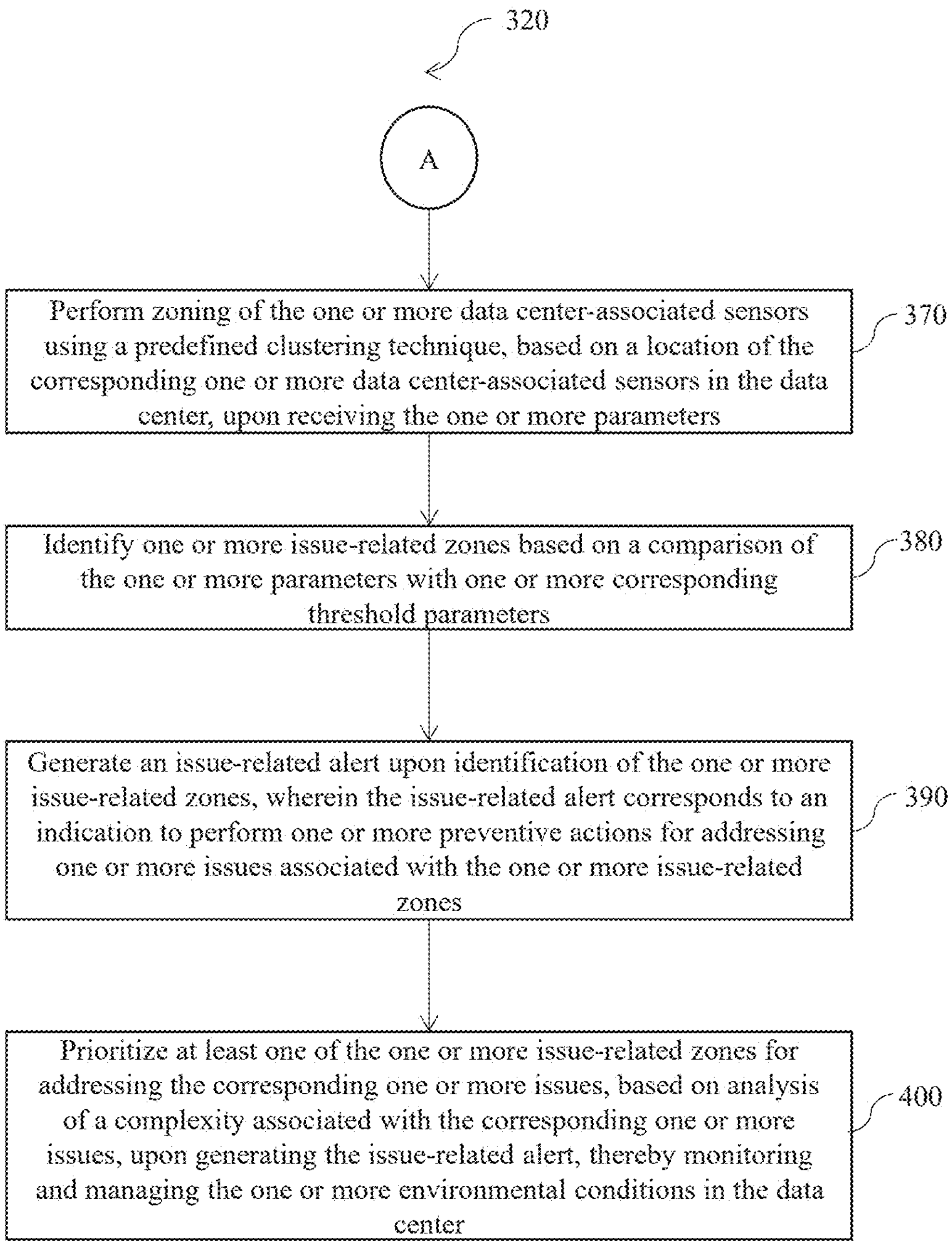

The memory 300 includes a plurality of subsystems stored in the form of executable program which instructs the processor(s) 290 to perform method steps illustrated in FIG. 4. The memory 300 includes a processing subsystem 40 of FIG. 1. The processing subsystem 40 further has following modules: a tracking module 50, a monitoring module 60, a zoning module 90, a zone identification module 100, and an issue addressing module 110.

The tracking module 50 is configured to record an attendance for the first user based on an activation status corresponding to the monitoring entity 20.

The monitoring module 60 is configured to receive one or more parameters corresponding to the corresponding one or more environmental conditions in real-time, when the first user initiates a routine-monitoring walk inside of the data center based on the monitoring schedule, upon recording a positive attendance for the first user. The one or more parameters are captured via at least one of one or more entity-associated sensors 70 and one or more data center-associated sensors 80.

The zoning module 90 is configured to perform zoning of the one or more data center-associated sensors 80 using a predefined clustering technique, based on a location of the corresponding one or more data center-associated sensors 80 in the data center, upon receiving the one or more parameters.

The zone identification module 100 is configured to identify one or more issue-related zones based on a comparison of the one or more parameters with one or more corresponding threshold parameters.

The issue addressing module 110 is configured to generate an issue-related alert upon identification of the one or more issue-related zones, wherein the issue-related alert corresponds to an indication to perform one or more preventive actions for addressing one or more issues associated with the one or more issue-related zones. The issue addressing module 110 is also configured to prioritize at least one of the one or more issue-related zones for addressing the corresponding one or more issues, based on analysis of a complexity associated with the corresponding one or more issues, upon generating the issue-related alert, thereby monitoring and managing the one or more environmental conditions in the data center.

The bus 310 as used herein refers to be internal memory channels or computer network that is used to connect computer components and transfer data between them. The bus 310 includes a serial bus or a parallel bus, wherein the serial bus transmits data in a bit-serial format and the parallel bus transmits data across multiple wires. The bus 310 as used herein, may include but not limited to, a system bus, an internal bus, an external bus, an expansion bus, a frontside bus, a backside bus, and the like.

FIG. 4(*a*) is a flow chart representing steps involved in a method 320 for monitoring and managing one or more environmental conditions in a data center in accordance with an embodiment of the present disclosure. FIG. 4(*b*) is a flow chart representing continued steps involved in the method 320 of FIG. 4(*a*) in accordance with an embodiment of the present disclosure. The method 320 includes activating a monitoring entity when worn by a first user upon registration, wherein the monitoring entity is worn based on a monitoring schedule corresponding to the monitoring of the one or more environmental conditions inside of the data center, wherein the monitoring schedule is set by a second user upon registration in step 330.

The method 320 also includes enabling an operative coupling of the monitoring entity with a controller unit, wherein the controller unit includes a processing subsystem configured to execute on a network to control bidirectional communications among a plurality of modules in step 340.

Furthermore, the method 320 includes recording an attendance for the first user based on an activation status corresponding to the monitoring entity in step 350. In one embodiment, recording the attendance for the first user may include recording the attendance for the first user via a tracking module 50 of the processing subsystem.

Furthermore, the method 320 also includes receiving one or more parameters corresponding to the corresponding one or more environmental conditions in real-time, when the first user initiates a routine-monitoring walk inside of the data center based on the monitoring schedule, upon recording a positive attendance for the first user, wherein the one or more parameters are captured via at least one of one or more entity-associated sensors and one or more data center-associated sensors in step 360. In one embodiment, receiving the one or more parameters may include receiving the one or more parameters via a monitoring module 60 of the processing subsystem.

Moreover, the method 320 also includes performing zoning of the one or more data center-associated sensors using a predefined clustering technique, based on a location of the corresponding one or more data center-associated sensors in the data center, upon receiving the one or more parameters in step 370. In one embodiment, performing zoning of the one or more data center-associated sensors may include performing zoning of the one or more data center-associated sensors via a zoning module 90 of the processing subsystem.

In addition, the method 320 also includes identifying one or more issue-related zones based on a comparison of the one or more parameters with one or more corresponding threshold parameters in step 380. In one embodiment, identifying the one or more issue-related zones may include identifying the one or more issue-related zones via a zone identification module 100 of the processing subsystem.

The method 320 also includes generating an issue-related alert upon identification of the one or more issue-related zones, wherein the issue-related alert corresponds to an indication to perform one or more preventive actions for addressing one or more issues associated with the one or more issue-related zones in step 390. In one embodiment, generating the issue-related alert may include generating the issue-related alert via an issue addressing module 110 of the processing subsystem.

Further, the method 320 also includes prioritizing at least one of the one or more issue-related zones for addressing the corresponding one or more issues, based on an analysis of a complexity associated with the corresponding one or more issues, upon generating the issue-related alert, thereby monitoring and managing the one or more environmental conditions in the data center in step 400. In one embodiment, prioritizing at least one of the one or more issue-related zones may include prioritizing at least one of the one or more issue-related zones via the issue addressing module 110 of the processing subsystem.

Various embodiments of the present disclosure enable monitoring and managing of the one or more environmental conditions in the data center more efficiently and more effectively, as the system generates pro-active alerts based on changes in the one or more environmental conditions in the data center. Also, the monitoring unit along with the controller unit captures the one or more parameters corresponding to the one or more environmental conditions without any human intervention, thereby making the system more reliable.

Further, the generation of the pro-active alerts brings the effectiveness of site operation teams by helping in getting accurate data, saving time a cost by minimizing hardware failure. Furthermore, by getting reports generated, the prediction about the one or more expected issues can be made in advance, thereby making the system more efficient. Moreover, the safety of a technician wearing the monitoring entity and walking inside of the data center is taken care of by integrating the one or more safety entities with the monitoring entity and incorporating a feature of generating an alert upon detection of the displacement of the corresponding one or more safety entities.

While specific language has been used to describe the disclosure, any limitations arising on account of the same are not intended. As would be apparent to a person skilled in the art, various working modifications may be made to the method in order to implement the inventive concept as taught herein.

The figures and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, order of processes described herein may be changed and are not limited to the manner described herein. Moreover, the actions of any flow diagram need not be implemented in the order shown; nor do all of the acts need to be necessarily performed. Also, those acts that are not dependent on other acts may be performed in parallel with the other acts. The scope of embodiments is by no means limited by these specific examples.

I claim:

1. A system for monitoring and managing one or more environmental conditions in a data center comprising:

a monitoring entity adapted to get activated when worn by a first user upon registration, wherein the monitoring entity is worn based on a monitoring schedule corresponding to the monitoring of the one or more environmental conditions inside of the data center, wherein the monitoring schedule is set by a second user upon registration;

a controller unit operatively coupled to the monitoring entity, wherein the controller unit comprises:

a processing subsystem configured to execute on a network to control bidirectional communications among a plurality of modules comprising:

a tracking module configured to record an attendance for the first user based on an activation status corresponding to the monitoring entity;

a monitoring module operatively coupled to the tracking module, wherein the monitoring module is configured to receive one or more parameters corresponding to the corresponding one or more environmental conditions in real-time, when the first user initiates a routine-monitoring walk inside of the data center based on the monitoring schedule, upon recording a positive attendance for the first user, wherein the one or more parameters are captured via at least one of one or more entity-associated sensors and one or more data center-associated sensors;

a zoning module operatively coupled to the monitoring module, wherein the zoning module is configured to perform zoning of the one or more data center-associated sensors using a predefined clustering technique, based on a location of the corresponding one or more data center-associated sensors in the data center, upon receiving the one or more parameters;

a zone identification module operatively coupled to the zoning module, wherein the zone identification module is configured to identify one or more issue-related zones based on a comparison of the one or more parameters with one or more corresponding threshold parameters; and an issue addressing module operatively coupled to the zone identification module, wherein the issue addressing module is configured to:

generate an issue-related alert upon identification of the one or more issue-related zones, wherein the issue-related alert corresponds to an indication to perform one or more preventive actions for addressing one or more issues associated with the one or more issue-related zones; and prioritize at least one of the one or more issue-related zones for addressing the corresponding one or more issues, based on an analysis of a complexity associated with the corresponding one or more issues, upon generating the issue-related alert, thereby monitoring and managing the one or more environmental conditions in the data center.

2. The system as claimed in claim 1, wherein the one or more entity-associated sensors and the one or more data center-associated sensors comprises at least one of one or more Internet of Things sensors, a temperature sensor, a corrosion sensor, a thermal camera, a cliff sensor, and an Infrared sensor.

3. The system as claimed in claim 1, wherein the issue addressing module is configured to identify a shortest distance to the corresponding one or more issue-related zones from an entry point of the data center based on an analysis of a layout of the data center, upon prioritizing.

4. The system as claimed in claim 1, wherein the tracking module is configured to track and record at least one of a timestamp and a frequency of an entry and an exit of the first user corresponding to the data center based on the attendance recorded.

5. The system as claimed in claim 1, comprises one or more safety entities integrated with the monitoring entity, wherein the one or more safety entities are adapted to generate a safety-issue alert, upon detection of a displacement of the corresponding one or more safety entities.

6. The system as claimed in claim 5, wherein the one or more safety entities are adapted to get activated upon detection of a deviation of a safety-related parameter inside of the data center from a threshold safety-related parameter value.

7. The system as claimed in claim 1, wherein the processing subsystem comprises a report generation module operatively coupled to the issue addressing module, wherein the report generation module is configured to generate a report personalized to the first user in real-time upon completion of the routine-monitoring walk by the first user, wherein the report comprises a plurality of details corresponding to the monitoring and managing of the one or more environmental conditions in the data center.

8. The system as claimed in claim 7, wherein the processing subsystem comprises an issue prediction module operatively coupled to the report generation module, wherein the issue prediction module is configured to perform data analytics on the corresponding report, by generating one or more trends corresponding to the plurality of details extracted from the report over a predefined time period.

9. The system as claimed in claim 8, wherein the issue prediction module is configured to predict one or more expected issues corresponding to the one or more environmental conditions inside of the data center using an artificial intelligence-based trained model, based on the data analytics performed on the corresponding report.

10. A method for monitoring and managing one or more environmental conditions in a data center comprising:

activating a monitoring entity when worn by a first user upon registration, wherein the monitoring entity is worn based on a monitoring schedule corresponding to the monitoring of the one or more environmental conditions inside of the data center, wherein the monitoring schedule is set by a second user upon registration;

enabling an operative coupling of the monitoring entity with a controller unit, wherein the controller unit comprises a processing subsystem configured to execute on a network to control bidirectional communications among a plurality of modules;

recording, via a tracking module of the processing subsystem, an attendance for the first user based on an activation status corresponding to the monitoring entity;

receiving, via a monitoring module of the processing subsystem, one or more parameters corresponding to the corresponding one or more environmental conditions in real-time, when the first user initiates a routine-monitoring walk inside of the data center based on the monitoring schedule, upon recording a positive attendance for the first user, wherein the one or more parameters are captured via at least one of one or more entity-associated sensors and one or more data center-associated sensors;

performing, via a zoning module of the processing subsystem, zoning of the one or more data center-associated sensors using a predefined clustering technique, based on a location of the corresponding one or more data center-associated sensors in the data center, upon receiving the one or more parameters;

identifying, via a zone identification module of the processing subsystem, one or more issue-related zones based on a comparison of the one or more parameters with one or more corresponding threshold parameters;

generating, via an issue addressing module of the processing subsystem, an issue-related alert upon identification of the one or more issue-related zones, wherein the issue-related alert corresponds to an indication to perform one or more preventive actions for addressing one or more issues associated with the one or more issue-related zones; and prioritizing, via the issue addressing module of the processing subsystem, at least one of the one or more issue-related zones for addressing the corresponding one or more issues, based on an analysis of a complexity associated with the corresponding one or more issues, upon generating the issue-related alert, thereby monitoring and managing the one or more environmental conditions in the data center.

* * * * *